US007901219B2

(12) United States Patent
Sakiyama et al.

(10) Patent No.: US 7,901,219 B2
(45) Date of Patent: Mar. 8, 2011

(54) CONNECTING STRUCTURE FOR ACCESSORY DEVICE AND CABLE, WATERPROOFING STRUCTURE FOR ACCESSORY DEVICE, AND MOUNTING STRUCTURE FOR ACCESSORY DEVICE

(75) Inventors: Koji Sakiyama, Sakura (JP); Takehisa Ide, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 10/670,524

(22) Filed: Sep. 26, 2003

(65) Prior Publication Data

US 2004/0077213 A1 Apr. 22, 2004

(30) Foreign Application Priority Data

Sep. 30, 2002 (JP) ................................ P2002-287407
Sep. 30, 2002 (JP) ................................ P2002-287408

(51) Int. Cl.
*H01R 12/00* (2006.01)
*H05K 1/00* (2006.01)

(52) U.S. Cl. .......... 439/76.2; 439/604; 439/499; 439/468

(58) Field of Classification Search .................. 439/620, 439/76.2, 492–499, 466, 468, 555–558, 552, 439/620.22
See application file for complete search history.

(56) References Cited

U.S. PATENT DOCUMENTS

| | | | | |
|---|---|---|---|---|
| 5,062,807 | A * | 11/1991 | Guss, III | 439/490 |
| 5,125,852 | A * | 6/1992 | Archer | 439/555 |
| 5,238,426 | A * | 8/1993 | Arnett | 439/557 |
| 5,433,625 | A | 7/1995 | Tsuji et al. | |
| 5,443,403 | A * | 8/1995 | Weidler et al. | 439/557 |
| 5,620,333 | A * | 4/1997 | Boyle | 439/471 |
| 6,196,863 | B1 | 3/2001 | Schwant | |
| 6,652,293 | B2 * | 11/2003 | Fuchs et al. | 439/76.1 |

FOREIGN PATENT DOCUMENTS

| | | | |
|---|---|---|---|
| EP | 0 575 072 | A1 | 12/1993 |
| JP | 61-59388 | A | 4/1986 |
| JP | 5-346461 | | 12/1993 |
| JP | 6-21288 | A | 3/1994 |
| JP | 2002-71789 | A | 3/2002 |
| JP | 2002-184514 | | 6/2002 |
| JP | 2002-231375 | | 8/2002 |

* cited by examiner

*Primary Examiner* — Felix O Figueroa
(74) *Attorney, Agent, or Firm* — Sughrue Mion, PLLC

(57) ABSTRACT

In this connecting structure for auxiliary machinery and cable is a connecting structure, a plurality of conductors are surrounded by an insulating covering and arrayed in a flat configuration and an auxiliary machinery that attaches directly to this cable; and characterized in that the auxiliary machinery is provided with a housing being equipped with a board on which electronic components are mounted and to which a specific circuitry pattern has been formed, a connection terminal that is connected to the circuitry pattern on the board and to at least one conductor among the conductors of the cable, and a molded part for sealing the connections between the connection terminal of the housing and the conductors of the cable; and the cable is disposed so as to extend along the outside of the auxiliary machinery.

17 Claims, 9 Drawing Sheets

CONNECTING STRUCTURE FOR ACCESSORY DEVICE AND CABLE, WATERPROOFING STRUCTURE FOR ACCESSORY DEVICE, AND MOUNTING STRUCTURE FOR ACCESSORY DEVICE

BACKGROUND OF THE INVENTION

1. Field of the Invention

The present invention relates to auxiliary machineries composed of electrical components, such as sensors, that are installed in automobiles and the like. More specifically, the present invention relates to a connecting structure for a auxiliary machinery and a cable and a waterproofing structure for the auxiliary machinery in which the space required for mounting the auxiliary machinery and for connecting the auxiliary machinery to the cable in a wire harness interconnecting auxiliary machineries can be made smaller, and the number of component parts can be reduced. The present invention further relates to a mounting structure for the auxiliary machinery in which the size of the space required for mounting the auxiliary machinery to a member in which the auxiliary machinery is mounted (hereinafter called "receiving member") can be reduced.

Priority is claimed on Japanese Patent Applications Nos. 2002-287407 and 2002-287408, filed Sep. 30, 2003, the content of which is incorporated herein by reference.

2. Description of the Related Art

As shown in FIGS. 11 and 12, it has been the conventional practice to electrically connect an auxiliary machinery 100, such as a sensor to be installed in an automobile or the like, by attaching a connector 111, which houses a connection terminal that is connected to a cable 112 in a wire harness, to a connector engaging member 102 in housing 101, which houses a sensor board 109 and the like. Since a high degree of water resistance may be required of this type of auxiliary machinery 100 depending on where it is to be installed, a complete waterproofing process is performed on auxiliary machinery 100 by, for example, filling the inside of housing 101 with a sealer 108 such as silicon grease in order to seal (waterproof) sensor board 109 and connector engaging member 102, and then covering this filled area with a cover 107. Naturally, a waterproofing process using a sealer or the like is also carried out to the areas of connection between connector 111 and connector engaging member 102. An auxiliary machinery 100 with this type of design is usually firmly mounted to its site of attachment, i.e., receiving member 120, on a panel, etc., using a fastening member 121 such as a clip (see Japanese Patent Applications, First Publication Nos. 5-346461, 2002-184514, and 2002-231375, for example).

However, in the above-described auxiliary machinery 100, a connector 111 is required in order to connect housing 101 and cable 112. For this reason, it is necessary to ensure that there is adequate space to permit connection in the direction indicated by arrow h1 in FIG. 11. In addition, about the same amount of space is needed in order to dispose auxiliary machinery 100. Further, when waterproofing this type of auxiliary machinery 100, other parts, such as silicon grease 108 or cover 107, are separately required to complete the process, so that the number of components increases.

In addition, because auxiliary machinery 100 is mounted to receiving member 120 via fastening member 121, a space for inserting and withdrawing fastening member 121 into/out of housing 101 is required in the direction indicated by arrow h2 in FIG. 11. For this reason, the overall space required to dispose auxiliary machinery 100 increases.

SUMMARY OF THE INVENTION

The present invention was conceived in view of the above-described circumstances and has as its objective the provision a connecting structure and a waterproofing structure for an auxiliary machinery and a cable, in which it is possible to reduce the space required for connecting the auxiliary machinery and the cable and the space required for mounting the auxiliary machinery to a receiving member, and to decrease the number of parts required for waterproofing.

It is a further objective of the present invention to provide a mounting structure for the auxiliary machinery in which the amount of the space required for disposing the auxiliary machinery to the receiving member can be reduced.

The connecting structure for auxiliary machinery and cable according to the present invention is a structure for connecting a cable in which a plurality of conductors are surrounded by an insulating covering and arrayed in a flat configuration and an auxiliary machinery that attaches directly to this cable; and characterized in that the auxiliary machinery is provided with a housing being equipped with a board on which electronic components are mounted and to which a specific circuitry pattern has been formed, a connection terminal that is connected to the circuitry pattern on the board and to at least one conductor among the conductors of the cable, and a molded part for sealing the connections between the connection terminal of the housing and the conductors of the cable; and the cable is disposed so as to extend along the outside of the auxiliary machinery.

The waterproofing structure for auxiliary machinery according to the present invention is a structure for waterproofing an auxiliary machinery that is directly connected to a cable in which a plurality of conductors are surrounded by an insulating covering and arrayed in a flat configuration; and characterized in that the auxiliary machinery is provided with a housing being equipped with a board on which electronic components are mounted and to which a specific circuitry pattern has been formed, a connection terminal that is connected to the circuitry pattern on the board and to at least one conductor among the conductors of the cable, and a molded part for sealing the connections between the connection terminal of the housing and the conductors of the cable.

In the present invention, the cable can be directly connected to the auxiliary machinery without using a connector, and is disposed so as to extend along the outside of the auxiliary machinery. As a result, it is possible to decrease the space needed for connecting the auxiliary machinery with the cable, as well as to reduce the space required for disposing the auxiliary machinery to a receiving member. In addition, in the present invention, a molded part is used to seal the connection portion between the connection terminals of the housing of the auxiliary machinery and the conductors of the cable. As a result, waterproofing components such as silicon grease or covers that were required in the conventional art are not needed in the present invention, making it possible to reduce the number of parts.

Note that it is also acceptable to directly couple the auxiliary machinery to the end of the cable, by directing the end of the cable toward the proximal end portion of the housing of the auxiliary machinery and connecting the conductors near the end of the cable to the proximal end portion of the connecting terminal along a direction that is perpendicular to the axes of the conductors; in this arrangement, the cable is installed so as to lie along the outside of the housing extending over a specific distance from the proximal end to the distal end of the housing, and such that the axes of the conductors bend in a direction perpendicular to the side of the housing. By disposing the cable in this way, it is possible to effectively prevent an increase in the space required for connecting and disposing the auxiliary machinery.

The mounting structure for auxiliary machinery according to the present invention is a structure for mounting an auxiliary machinery that is directly coupled to a cable in which a plurality of conductors are surrounded by an insulating covering and arrayed in a flat configuration to a receiving member, characterized in that: the receiving member is provided with a mounting hole for mounting the auxiliary machinery; and the auxiliary machinery is provided with a housing in which a distal end thereof can engage in the mounting hole and being equipped with a board on which electronic components are mounted and to which a specific circuitry pattern has been formed, a connection terminal which connects with the circuitry pattern on the board and with at least one of the conductors of the cable, a retainer that attaches to the distal end of the housing and the outer periphery of which engages in the mounting hole of the receiving member, and a molded part that seals the connecting portion between the connection terminal of the housing and the conductors of the cable; and wherein, the auxiliary machinery is mounted to the receiving member by attaching the retainer in the mounting hole from one side of the receiving member, and attaching the housing of the auxiliary machinery to the retainer from the other side of the receiving member.

In the present invention, the auxiliary machinery is mounted to the receiving member by attaching the retainer in the mounting hole from one side of the receiving member and attaching the housing to the retainer which has attached to the receiving member from the other side of the receiving member. As a result, it is not necessary to provide space at the auxiliary machinery housing mounting side of the receiving member, for inserting or withdrawing fastening members such as the clips that have been employed in the conventional art. Thus, the overall space needed to dispose the auxiliary machinery can be reduced.

Note that it is preferable that the retainer is provided with a collar for interlocking with the periphery of the mounting hole from the side opposed to the side in which the housing is attached, a projecting part for interlocking with the periphery of the mounting hole from the side in which the housing is attached, and an interlocking projection that interlocks with the housing.

Alternatively, it is preferable that the retainer is provided with a collar for interlocking with the periphery of the mounting hole from the side opposed to the side in which the housing is attached and an interlocking projection that interlocks with the housing. In this case, the auxiliary machinery be mounted and firmly fixed to the receiving member in a state such that the peripheries of either open side of the mounting hole are held between the collar of the retainer and the distal end of the housing after it has been mounted in the retainer.

PREFERRED EMBODIMENTS OF THE INVENTION

Preferred embodiments of the present invention will now be explained with reference to the accompanying figures.

Figure 1:
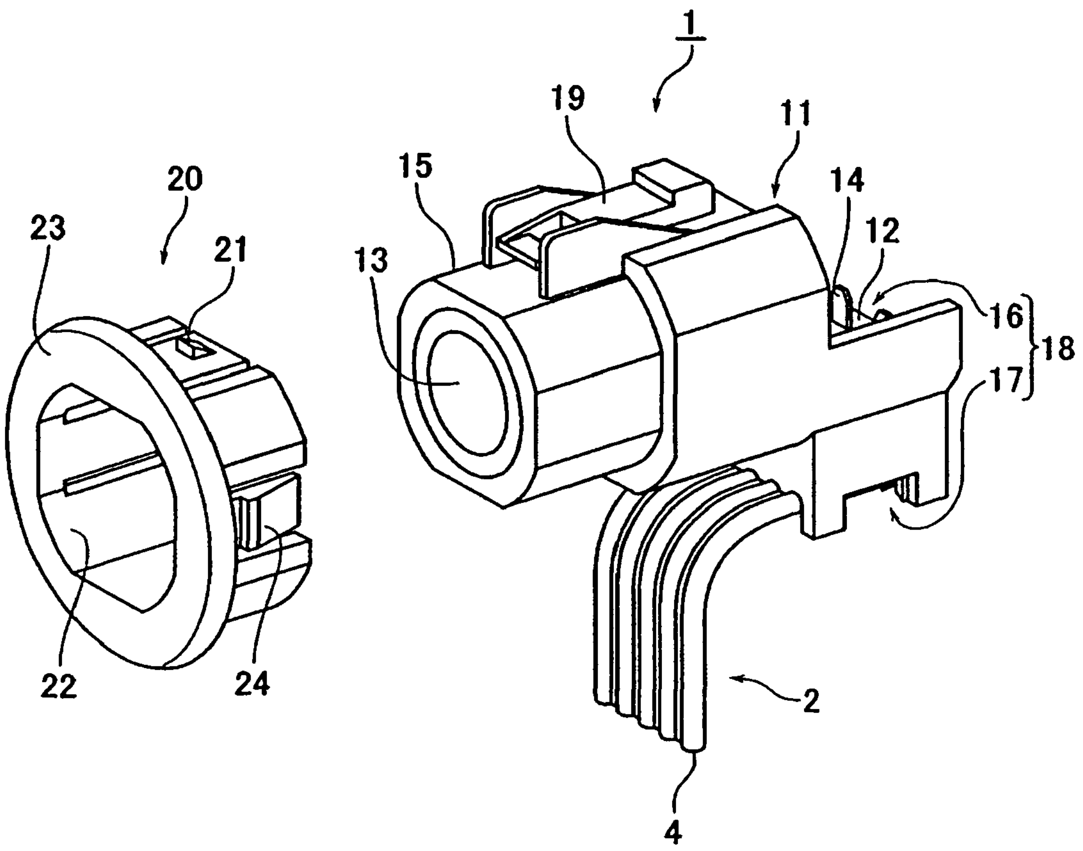
FIG. 1 is a disassembled diagonal perspective view of an auxiliary machinery, omitting a portion thereof, in which the connecting structure for auxiliary machinery and cable and the water proofing structure according to an embodiment of the present invention are employed.
Figure 2:
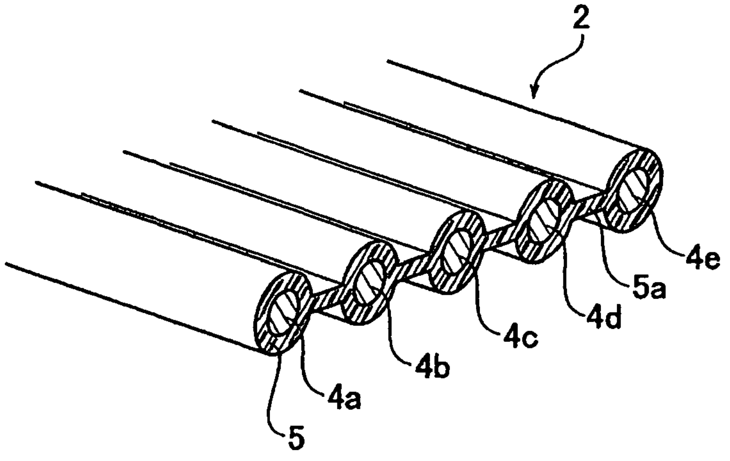
FIG. 2 is a diagonal perspective view for showing a cross-section through the cable connected to the auxiliary machinery.
Figure 3A:
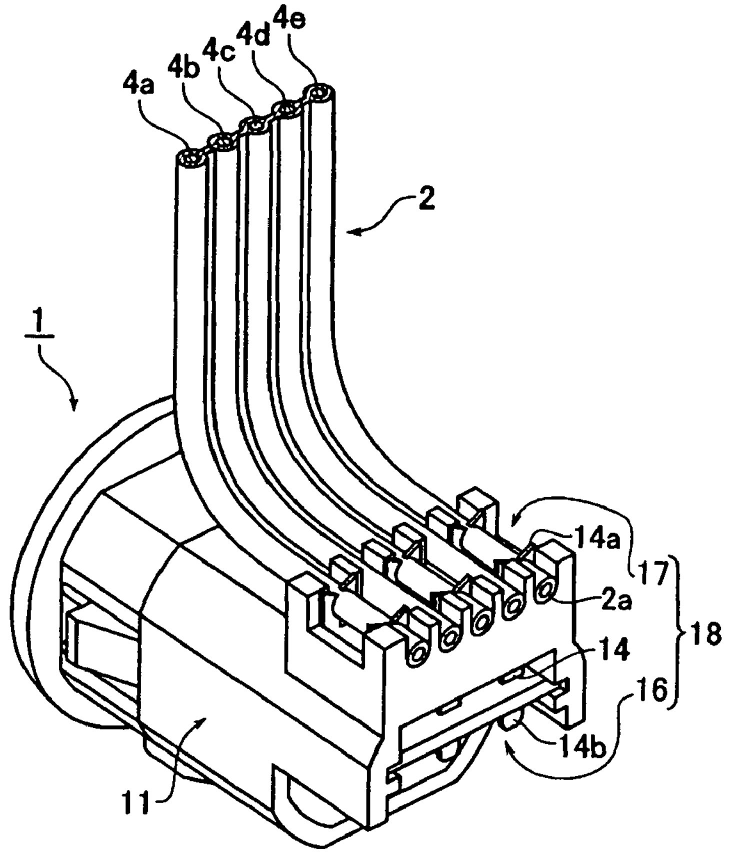
FIG. 3A is a perspective view for explaining the connecting structure for auxiliary machinery and cable according to an embodiment of the present invention, with a portion of the auxiliary machinery omitted from the figure.
Figure 3B:
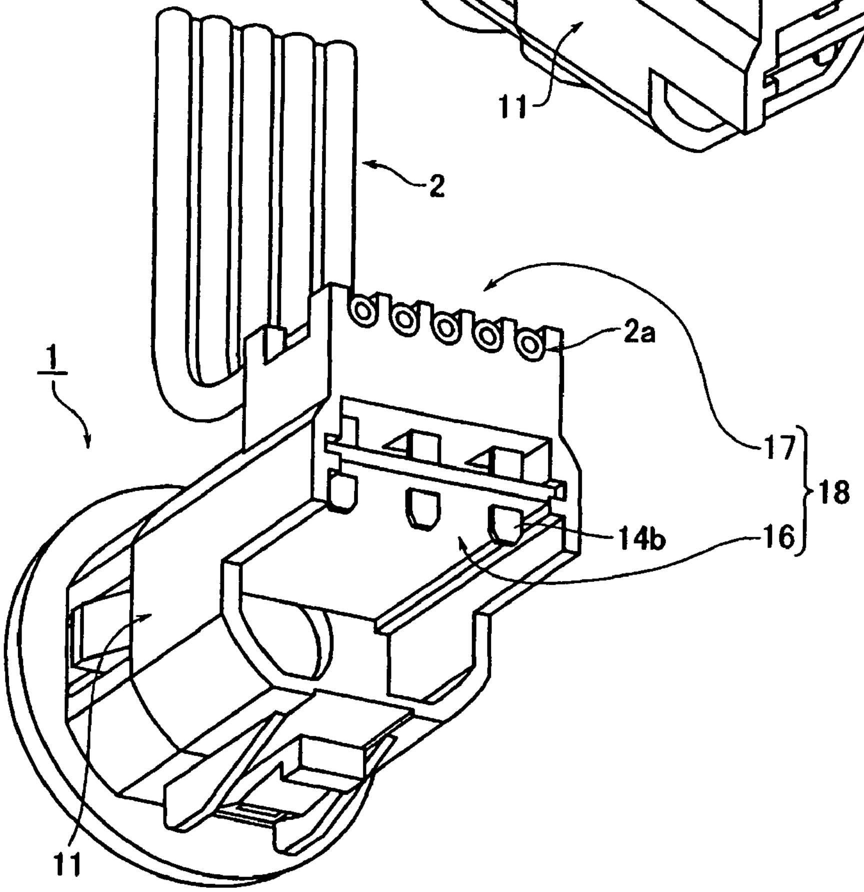
FIG. 3B is a perspective view for explaining the connecting structure for auxiliary machinery and cable according to an embodiment of the present invention, with a portion of the auxiliary machinery omitted from the figure.
Figure 4A:
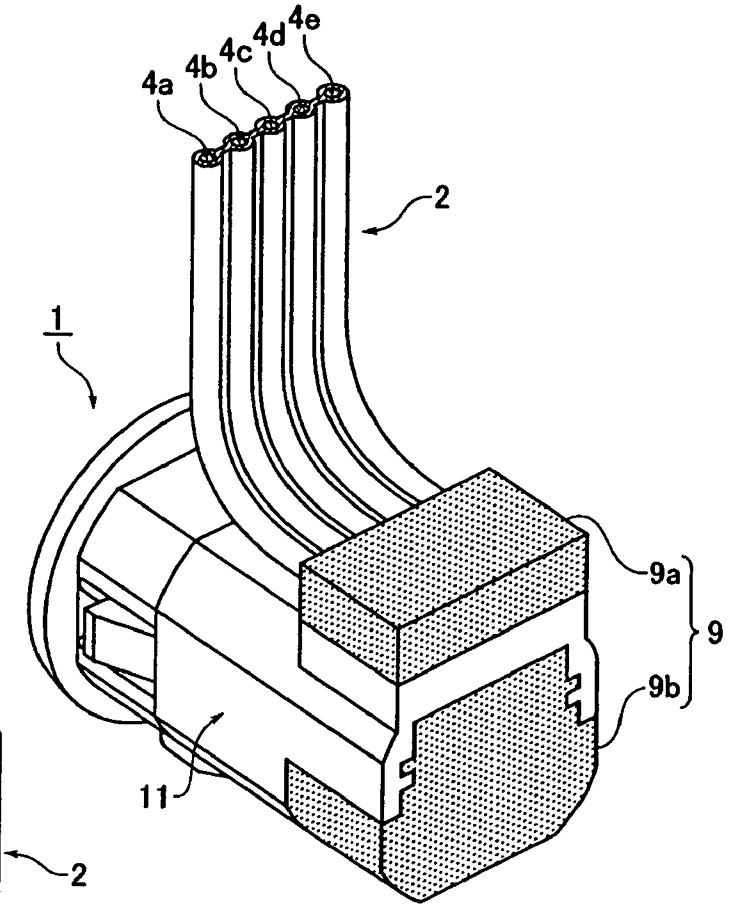
FIG. 4A is a perspective view for explaining the waterproofing structure for auxiliary machinery according to an embodiment of the present invention.
Figure 4B:
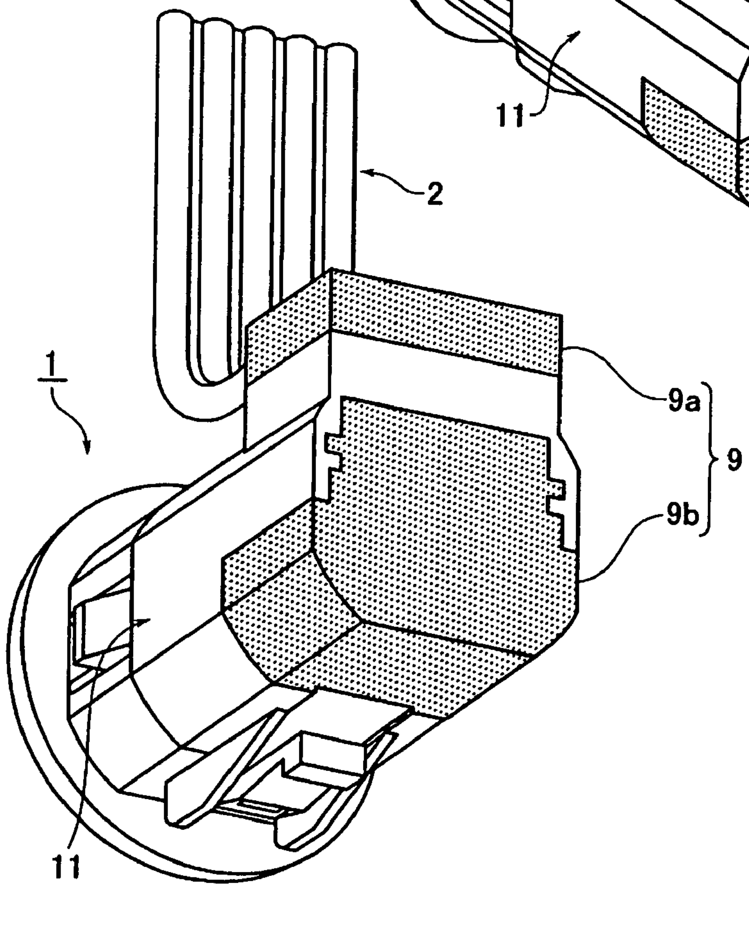
FIG. 4B is a perspective view for explaining the waterproofing structure for auxiliary machinery according to an embodiment of the present invention.

FIG. 1 is a disassembled diagonal perspective view of an auxiliary machinery, omitting a portion thereof, in which the connecting structure for auxiliary machinery and cable and the waterproofing structure according to an embodiment of the present invention are employed. FIG. 2 is a diagonal perspective view for showing a cross-section through the cable that is connected to this same auxiliary machinery. FIGS. 3A and 3B are perspective views for explaining the connecting structure for auxiliary machinery and cable according to an embodiment of the present invention, a portion of the auxiliary machinery being omitted from the figures. FIGS. 4A and 4B are perspective views for explaining the waterproofing structure for auxiliary machinery according to an embodiment of the present invention.

As shown in FIG. 1, sensor 1, which is the auxiliary machinery employed in this example, is provided with a housing 11 consisting of a resin molded product, for example, a board 12 that is housed within housing 11, a sensor component 13 that is mounted on board 12, a connection terminal 14 that is connected to board 12, a retainer 20 which mounts on the distal end of housing 11, and a molded part (omitted from this figure) that is formed at the proximal end of housing 11 and will be explained below later. A retainer engaging member 15 for engaging retainer 20 is formed at the distal end of housing 11, and an exposed connecting portion 18 is formed at the proximal end of housing 11. Exposed connecting portion 18 provides exposed a board side connecting portion 16 for connecting the board 12 and connection terminal 14, and a terminal side connecting portion 17 for connecting the connection terminal 14 and conductor 4 being positioned opposite side of board side connecting portion 16 with connection terminal 14 intervening therebetween. An interlocking piece 19 is formed to part of housing 11 so that when retainer 20 is completely engaged in retainer engaging member 15, this interlocking piece 19 interlocks with an interlocking projection 21 that is formed to retainer 20, thereby stopping retainer 20 in housing 11 and holding it fast there (note that this interlocking projection 21 and interlocking piece 19 comprise the retainer interlocking mechanism).

Retainer 20 is provided with an engaging hole 22 in which retainer engaging member 15 of housing 11 engages, a collar 23 which interlocks with the periphery of a mounting hole that is formed in a panel, i.e., the receiving member here that will be explained further below, from the side opposite to the side of attachment of housing 11, and an interlocking claw 24 which interlocks with the periphery of the mounting hole on the side of attachment of housing 11 for mounting and fixing in place retainer 20 in the panel.

As shown in FIG. 2, cable 2 is a flat cable wherein rod-shaped conductors 4*a*, 4*b*, 4*c*, 4*d* and 4*e* comprising single or stranded wire formed from Cu or Al, for example, are covered by an insulating covering 5 consisting of an insulating resin such as polyethylene terephthalate (PET), polyethylene naphthalate (PEN), polyimide (PI), polyolefin (PO), or the like, and the insulating coverings 5 are joined to each other by a bridging member 5*a* consisting of the same insulating resin as that of insulating covering 5. Note that it is also acceptable for flat cable 2 to be a flexible flat cable having a structure wherein rectangular column shaped conductors are covered with an insulating covering 5 that is formed to be flat by means of a laminator or extrusion. Flat cable 2 may also be a so-called wire harness in which a plurality of conductors 4 are bundled into the form of a harness.

Cable 2 is disposed so as to extend along the outside of sensor 1 and is connected to housing 11 of sensor 1 as shown in FIGS. 3A and 3B for example. In other words, cable 2 is connected to housing 11 at terminal side connecting portion 17, by directing one end 2*a* of cable 2 toward the proximal side of housing 11, and connecting the conductors 4 (i.e., 4*a*, 4*c*, and 4*e* here) near cable end 2*a* to pressure welded parts 14*a* which are positioned on the tip end of connection terminal 14 along a direction that is perpendicular to the axes of the conductors 4. Regarding connection terminal 14, note that it is a pressure welded terminal in which the tips of these pressure welded parts 14*a* are divided into two parts, with conductors 4 being held between these divided parts and weld-connected. The cable 2 connected to housing 11 in this way is installed to lie along the side of housing 11, extending a specific range from the proximal side to the distal side of housing 11, and in an arrangement such that the axial direction of each of conductors 4*a*~4*e* is curved so as to extend along the direction of their connection to pressure welded parts 14*a* in connection terminal 14, i.e., cable 2 is bent in a direction that is perpendicular to the side of housing 11.

Figure 5:
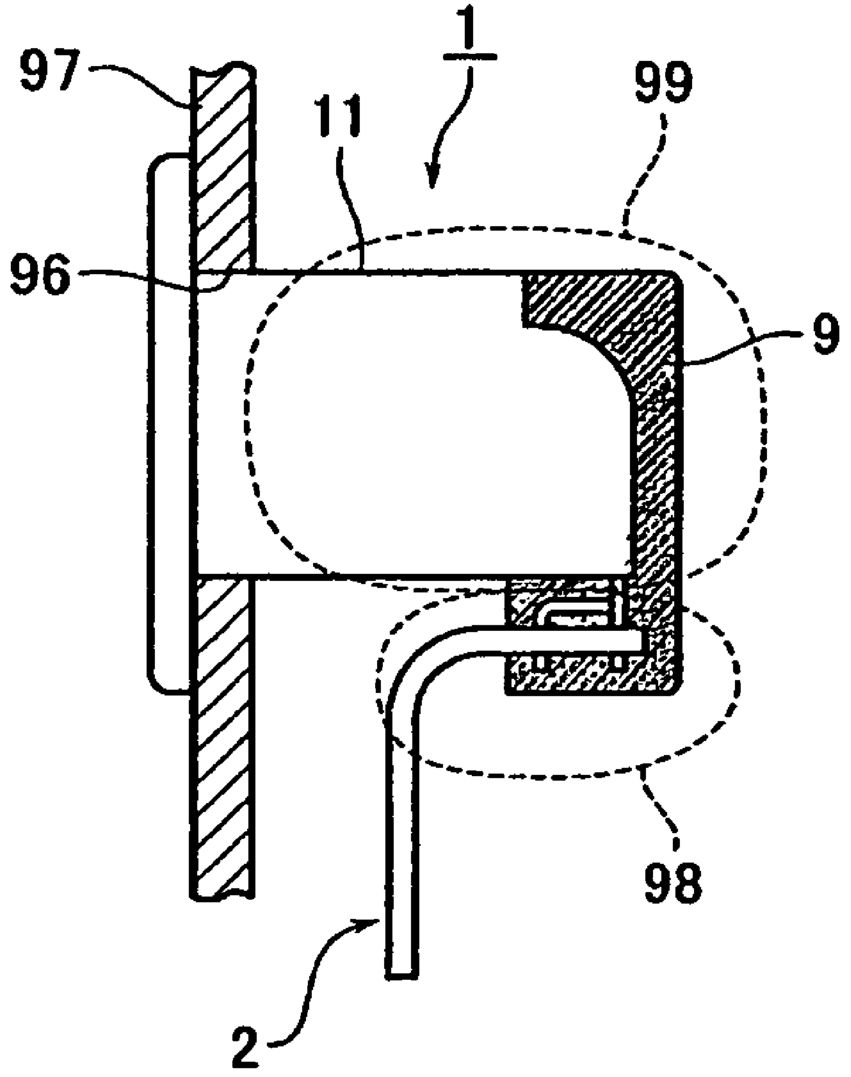
FIG. 5 is a schematic partial cross-section for explaining the auxiliary machinery mounted in a receiving member.

In this way, cable 2 can be connected to sensor 1 by directly connecting to housing 11, without employing a connector or the like. As a result, as shown in FIG. 5, when sensor 1 is mounted in mounting hole 96 in panel 97, the space 98 needed for connecting sensor 1 and cable 2 can be greatly reduced, and the space 99 needed to dispose sensor 1 can be made smaller as well.

The tip parts 14*b* of connection terminal 14 pass through board 12 and are connected to a circuit (not shown) on board 12 by soldering for example, at board side connecting portion 16 which is positioned opposite side of terminal side connecting portion 17 with connection terminal 14 interposed therebetween.

In housing, the area of connection between board 12 and connection terminal 14 and the area of connection between conductor 4 and connection terminal 14 are exposed at exposed connecting portion 18 which is consisting of board side connecting portion 16 and terminal side connecting portion 17. Since waterproofing treatment is not carried out on exposed connecting portion 18, this could prove problematic depending on where sensor 1 is installed. Therefore, as shown in FIG. 4, a molded part 9 (9*a*, 9*b*) is formed to the proximal side of housing 11 for sealing board side connecting portion 16 and terminal side connecting portion 17 by encompassing exposed connecting portion 18 in a unitary manner with housing 11.

This molded part 9 (9*a*, 9*b*) is formed by filling a mold with a molding resin such as a hot melt resin and then hardening it. Molded part 9 is formed in a unitary manner to conform to the shape of exposed connecting portion 18 on housing 11. By forming molded parts 9*a*, 9*b* to housing 11 in this way, it is possible to carry out a waterproofing treatment to exposed connecting portion 18, which consists of board side connecting portion 16 and terminal side connecting portion 17, without requiring silicon grease, covers, etc., as was the case in the conventional art. Moreover, the connection between pressure welded parts 14*a* of connection terminal 14 and conductor 4 of cable 2 at terminal side connecting portion 17 can be strongly maintained. As a result, the number of parts required for waterproofing sensor 1 can be reduced.

Note that each of the molded parts 9*a*, 9*b* in the molded part 9 in this example were formed separately. However, as shown in FIG. 5, it is also acceptable to mold the entire proximal side of housing 11, and form molded part 9 such that it seals exposed connecting portion 18 of housing 11.

Figure 6:
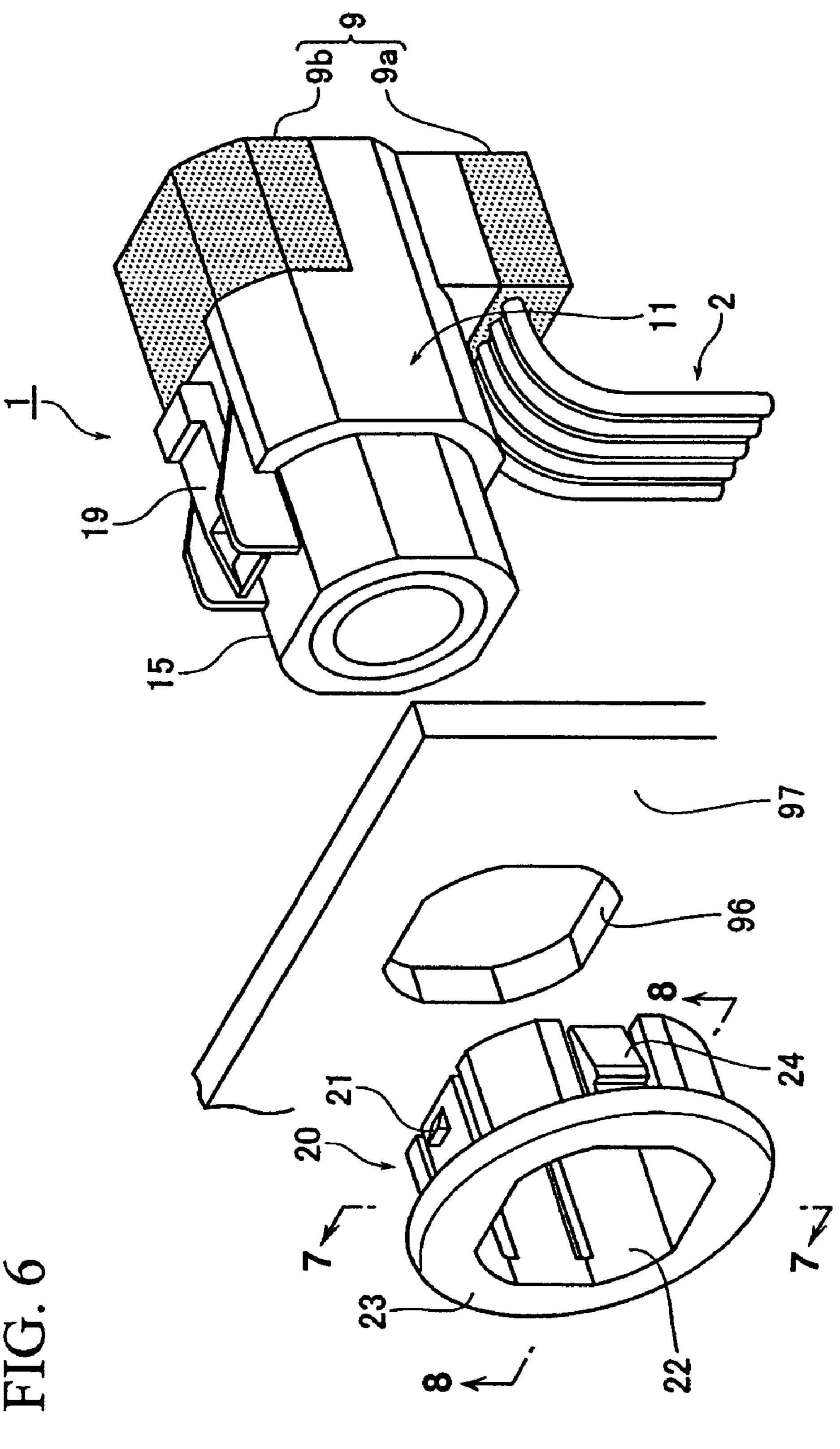
FIG. 6 is a disassembled diagonal perspective for explaining the mounting structure for the auxiliary machinery according to an embodiment of the present invention.
Figure 7:
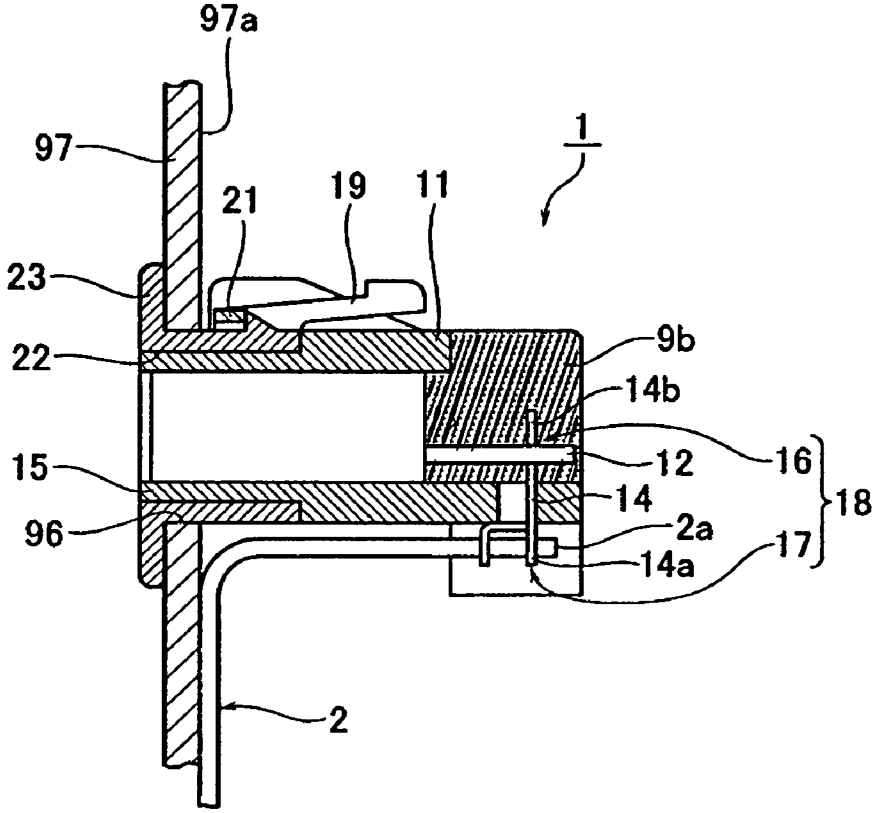
FIG. 7 is a cross-sectional view along the line A-A' in FIG. 6 for explaining the mounting structure for mounting the auxiliary machinery to the receiving member.
Figure 8:
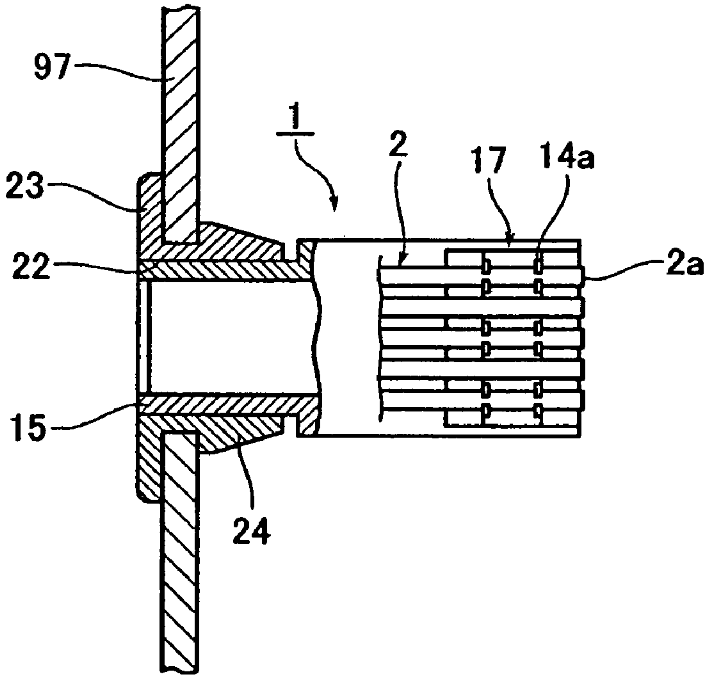
FIG. 8 is a cross-sectional view along the line B-B' in FIG. 6 for explaining the mounting structure for mounting the auxiliary machinery to the receiving member.

The sensor 1 having this type of structure is mounted to a panel 97 as shown specifically in FIGS. 6 through 8. In this case, first, as shown in FIG. 6, housing 11 and retainer 20 are disposed to either side of panel 97 so that retainer engaging member 15 on housing 11 and the retainer 20 side that attaches to housing 11 (i.e., the side opposite where collar 23 is formed) face one other with mounting hole 96 in panel 97 interposed therebetween. Next, as shown in FIGS. 7 and 8, interlocking claw 24 (not shown in the figures) is passed through mounting hole 96 in panel 97, and attaching retainer 20 to panel 97 on the side opposite where housing 11 attaches. Retainer 20 interlocks and is held in place in panel 97 in this case because the periphery of mounting hole 96 in panel 97 is held between the collar 23 and interlocking claw 24 of retainer 20. Next, by engaging retainer engaging part 15 of housing 11 in engaging hole 22 of retainer 20, interlocking projection 21 of retainer 20 and interlocking piece 19 of housing 11 interlock, so that housing 11 interlocks and is held fast in retainer 20. As a result, sensor 1 can be mounted and firmly held in place in panel 97 with surety and ease.

Note that, as described above, exposed connecting portion 18, consisting of board side connecting portion 16 and terminal side connecting portion 17, on the proximal side of housing 11 are completely sealed by molded parts 9*a*, 9*b* (9*a* is omitted from the figure). As a result, moisture has no effect on board 12 or connection terminal 14. In addition, since cable 2 lies along the side of housing 11 in sensor 1 and extending a specific range from the proximal end to the distal end of the housing, and bends so as to extend along the direction of its connection to connection terminal 14, and this cable 2 is further installed so as to extend along surface 97*a* of panel 97, the space needed for disposing sensor 1 on panel 97 can be reduced.

In addition, sensor 1 is mounted and fixed in place on panel 97 by mounting retainer 20 in mounting hole 96 formed in panel 97, from the opposite side of attachment of housing 11, thereby mounting and fixing in place housing 11 in retainer 20. Therefore, it is not necessary to provide a space for inserting or withdrawing a fastening member such as the clips conventionally employed, to the housing 11 attachment side of panel 97. As a result, the space needed for disposing sensor 1 can be made smaller.

Figure 9A:
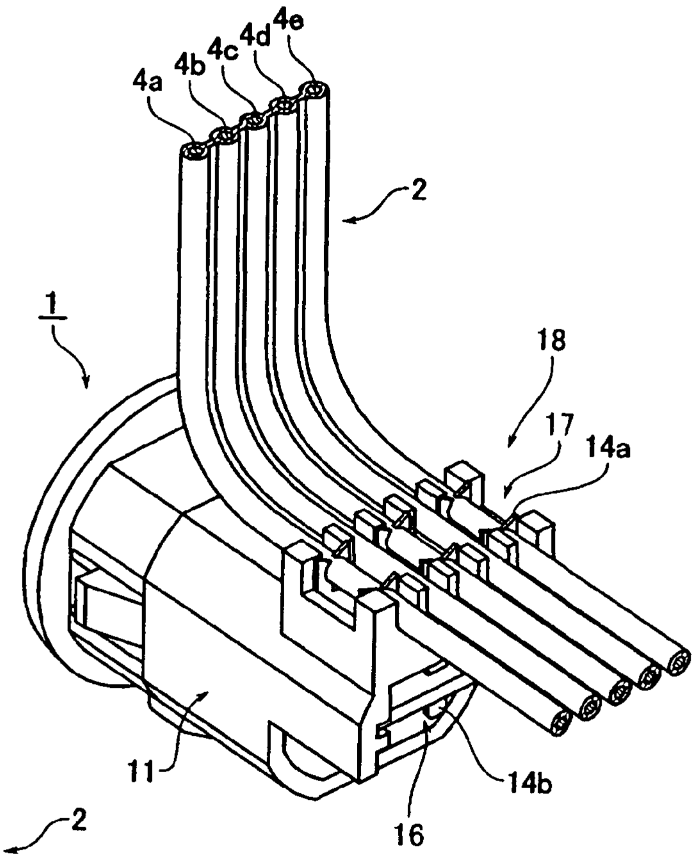
FIG. 9A is a perspective view for explaining the connecting structure for auxiliary machinery and cable according to another embodiment of the present invention, omitting a portion of the structure.
Figure 9B:
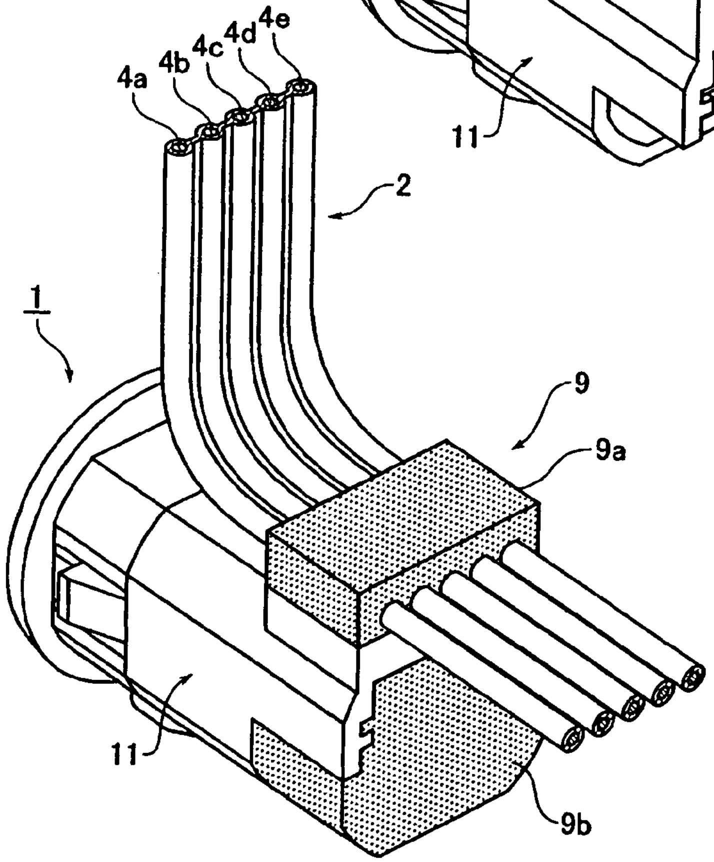
FIG. 9B is a perspective view for explaining the waterproofing structure for auxiliary machinery according to another embodiment of the present invention.

Note that it is also acceptable to connect cable 2 to terminal side connector 17 by connecting each of conductors 4*a* through 4*e* to pressure welded parts 14*a* of connection terminals 14 at intermediate areas thereof, as shown in FIG. 9. When forming molded part 9 (9*a*, 9*b*) with this type of connection arrangement, sensor 1 has the form as shown in FIG. 9B.

Figure 10:
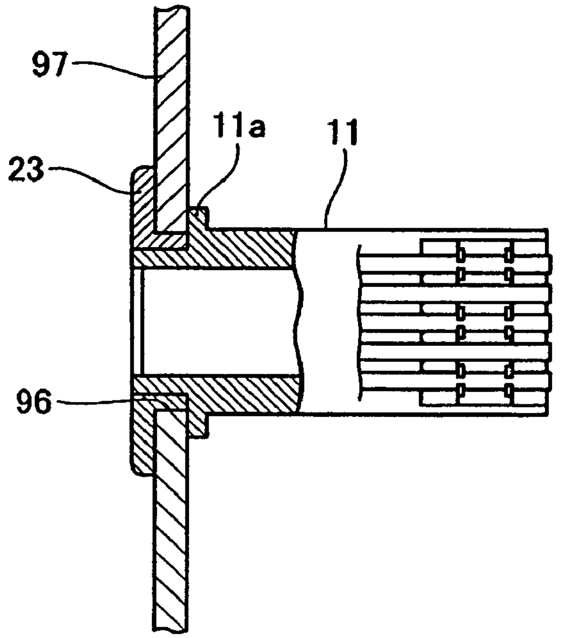
FIG. 10 is a cross-sectional view of the mounting structure for auxiliary machinery according to another embodiment of the present invention.
Figure 11:
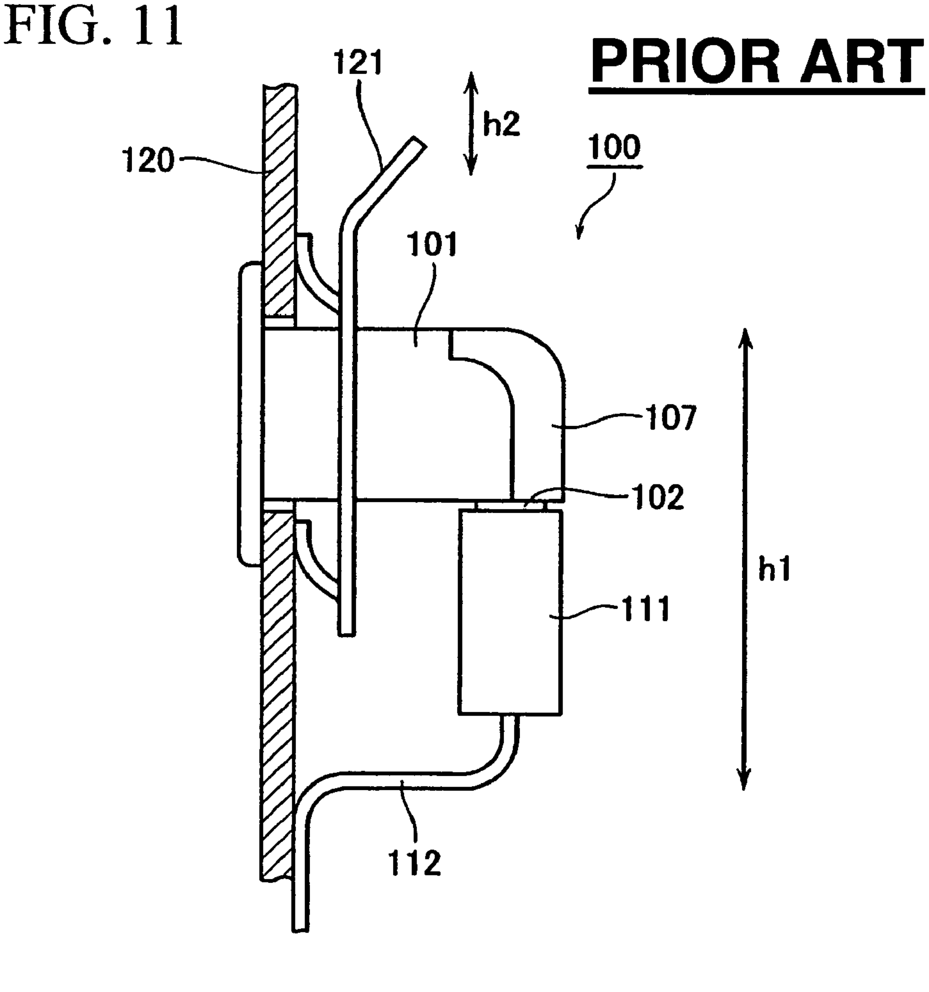
FIG. 11 PRIOR ART
FIG. 11 is a side view for explaining a conventional mounting structure for auxiliary machinery, showing a cross-section through one portion thereof.
Figure 12:
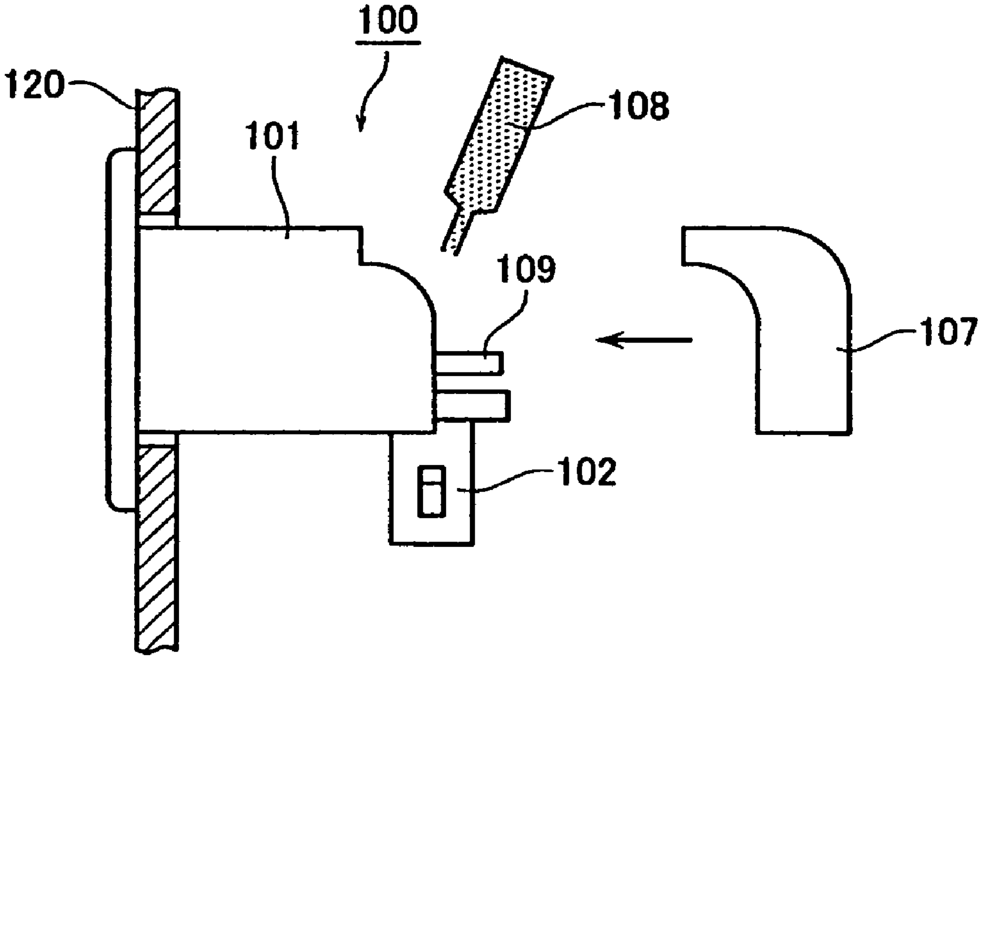
PRIOR ART FIG. 12
FIG. 12 is a disassembled side view for simply explaining a conventional waterproofing structure for auxiliary machinery, showing a cross-section through one portion thereof.

In addition to interlocking and fixing retainer 20 in mounting hole 96 using collar 23 and interlocking claw 24, it is also acceptable to employ other methods for mounting sensor 1 in panel 97. Namely, as shown in FIG. 10, it is also acceptable to mount and fix in place sensor 1 to panel 97 by holding the periphery of both openings of mounting hole 96 in panel 97 between collar 23 of retainer 20 and an end piece 11*a* that is formed to housing 11.

What is claimed is:

1. An electrical connecting apparatus comprising:

a housing;

a board side connecting portion separated from a terminal side connecting portion by a wall of said housing formed at a proximal end of said housing;

at least one discrete connection terminal disposed in the housing and having a proximal end extending from said wall into the board side connecting portion and a distal end extending from said wall in an opposite direction into the terminal side connecting portion;

a first discrete molded part for sealing said board side connecting portion and a second discrete molded part for sealing said terminal side connecting portion, said first and second discrete molded parts separated from each other by said housing; and a flat cable which extends on an outer surface of said housing in which said terminal side connecting portion is formed thereon, so as to extend along the outer surface of said housing;

wherein the proximal end of said discrete connection terminal forms electrical connection to a circuit board which is provided on the board side connecting portion, and the distal end of said discrete connection terminal forms electrical connection to at least one conductor of the flat cable at the terminal side connecting portion; and said flat cable is extended substantially parallel and adjacent to at least a portion of the housing which is perpendicular to a surface of a receiving member in which said housing is mounted thereon, and the flat cable is bent so as to extend along the surface of the receiving member.

2. The electrical connecting apparatus according to claim 1, wherein said second molded part further seals said connection between said at least one discrete connection terminal and said at least one conductor.

3. The electrical connecting apparatus according to claim 1, wherein the second molded part seals the at least one discrete connection terminal disposed within the terminal side connecting portion and the first molded part seals the board side connecting portion.

4. The electrical connecting apparatus according to claim 1, wherein the first molded part also seals the connection between the at least one discrete connection terminal and said circuit board.

5. The electrical connecting apparatus according to claim 1, wherein the first and second molded parts seal opposite end portions of said at least one discrete connection terminal.

6. A waterproofing structure for an electrical connecting apparatus comprising:

a housing;

a board side connecting portion separated from a terminal side connecting portion by a wall of said housing formed at a proximal end of said housing;

at least one discrete connection terminal disposed in the housing and having a proximal end extending from said wall into the board side connecting portion and a distal end extending from said wall in an opposite direction into the terminal side connecting portion;

a first discrete molded part for sealing said board side connecting portion and a second discrete molded part for sealing said terminal side connecting portion, said first and second discrete molded parts separated from each other by said housing; and a flat cable which extends on an outer surface of said housing in which said terminal side connecting portion is formed thereon, so as to extend along the outer surface of said housing;

wherein the proximal end of said discrete connection terminal forms electrical connection to a circuit board which is provided on the board side connecting portion, and the distal end of said discrete connection terminal forms electrical connection to at least one conductor of the flat cable at the terminal side connecting portion, and said flat cable is extended substantially parallel and adjacent to at least a portion of the housing which is perpendicular to a surface of a receiving member in which said housing is mounted thereon, and the flat cable is bent so as to extend along the surface of the receiving member.

7. The waterproofing structure according to claim 6, wherein said second molded part further seals said connection between said at least one discrete connection terminal and said at least one conductor.

8. The waterproofing structure according to claim 6, wherein the second molded part seals the at least one discrete connection terminal disposed within the terminal side connecting portion and the first molded part seals the board side connecting portion.

9. The waterproofing structure according to claim 6, wherein the first molded part also seals the connection between the at least one discrete connection terminal and said circuit board.

10. The waterproofing structure according to claim 6, wherein the first and second molded parts seal opposite end portions of said at least one discrete connection terminal.

11. An electrical connecting apparatus comprising:

a housing;

a board side connecting portion separated from a terminal side connecting portion by a wall of said housing formed at a proximal end of said housing;

at least one discrete connection terminal disposed in the housing and having a proximal end extending from said wall into the board side connecting portion and a distal end extending from said wall in an opposite direction into the terminal side connecting portion;

a mounting portion disposed at a distal end of said housing;

a retainer attachable to said mounting portion;

a first discrete molded part for sealing said board side connecting portion and a second discrete molded part for sealing said terminal side connecting portion, said first and second discrete molded parts separated from each other by said housing; and a flat cable which extends on an outer surface of said housing in which said terminal side connecting portion is formed thereon, so as to extend along the outer surface of said housing;

wherein the proximal end of said discrete connection terminal forms electrical connection to a circuit board which is provided on the board side connecting portion, and the distal end of said discrete connection terminal forms electrical connection to at least one conductor of the flat cable at the terminal side connecting portion;

said housing is mountable to a mounting hole in a receiving member by attaching said retainer in said mounting hole from one side of said receiving member, and attaching said mounting portion to said retainer from the other side of said receiving member; and said flat cable is extended substantially parallel and adjacent to at least a portion of the housing which is perpendicular to a surface of said receiving member, and the flat cable is bent so as to extend along the surface of said receiving member.

12. The electrical connecting apparatus according to claim 11, wherein said retainer comprises:

a collar larger than said mounting hole for contacting a surface of said receiving member on a side opposed to a side from which said mounting portion is attached;

a projecting part for interlocking with a periphery of said mounting hole on the side of said receiving member from which said mounting portion is attached; and an interlocking projection that interlocks with said mounting portion.

13. The electrical connecting apparatus according to claim 11, wherein said retainer comprises:

a collar larger than said mounting hole for contacting a surface of said receiving member on a side opposed to a side from which said mounting portion is attached; and an interlocking projection that interlocks with said mounting portion, wherein said housing is mounted to said receiving member such that said mounting portion is disposed within the periphery of said mounting hole after said mounting portion has been mounted in said retainer.

14. The electrical connecting apparatus according to claim 12, wherein said second molded part further seals said connection between said at least one discrete connection terminal and said at least one conductor.

15. The electrical connecting apparatus according to claim 12, wherein the second molded part seals the at least one discrete connection terminal disposed within the terminal side connecting portion and the first molded part seals the board side connecting portion.

16. The electrical connecting apparatus according to claim 12, wherein the first molded part also seals the connection between the at least one discrete connection terminal and said circuit board.

17. The electrical connecting apparatus according to claim 12, wherein the first and second molded parts seal opposite end portions of said at least one discrete connection terminal.

* * * * *